(12) United States Patent
Nakamuta et al.

(10) Patent No.: US 11,609,875 B2
(45) Date of Patent: Mar. 21, 2023

(54) DATA COMMUNICATION DEVICE AND DATA COMMUNICATION MODULE

(71) Applicant: Murata Manufacturing Co., Ltd., Kyoto (JP)

(72) Inventors: Kazuhiro Nakamuta, Kyoto (JP); Yuji Shintomi, Kyoto (JP); Satoshi Matsumura, Kyoto (JP); Toshiki Matsumura, Kyoto (JP); Satoru Matsuyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/212,465

(22) Filed: Mar. 25, 2021

(65) Prior Publication Data

US 2021/0303502 A1    Sep. 30, 2021

(30) Foreign Application Priority Data

Mar. 27, 2020 (JP) .............................. JP2020-058353

(51) Int. Cl.
*G06F 13/42* (2006.01)
*G06F 13/20* (2006.01)
*G06F 13/362* (2006.01)
*G11C 17/16* (2006.01)

(52) U.S. Cl.
CPC .......... *G06F 13/4282* (2013.01); *G06F 13/20* (2013.01); *G06F 13/362* (2013.01); *G11C 17/16* (2013.01)

(58) Field of Classification Search
USPC ..................... 710/14, 15, 29, 33, 36, 62, 313
See application file for complete search history.

(56) References Cited

U.S. PATENT DOCUMENTS 5,333,296 A * 7/1994 Bouchard ............... G06F 7/483
711/117
5,638,516 A * 6/1997 Duzett ............. G06F 15/17381
709/239

(Continued)

FOREIGN PATENT DOCUMENTS

JP       H08235109 A     9/1996
JP       2002236611 A    8/2002

(Continued)

*Primary Examiner* — Idriss N Alrobaye
*Assistant Examiner* — Henry W Yu
(74) *Attorney, Agent, or Firm* — Pearne & Gordon LLP

(57) ABSTRACT

A data communication device includes: a fixed value memory that stores a fixed value; a received data memory that stores received data inputted through a bus; an output data memory that stores output data; a comparison determination unit that outputs a comparison determination result signal indicating a determination result of comparing the fixed value and a value of the received data; a data output unit that has a first state of outputting the output data to the bus and a second state of not outputting the output data to the bus; a command analyzing unit that outputs a data output control signal based on a command; and an output controller that outputs a control signal for controlling the data output unit to enter the first state or the second state based on the comparison determination result signal and the data output control signal.

13 Claims, 9 Drawing Sheets

(56) References Cited

U.S. PATENT DOCUMENTS

| | | | | |
|---|---|---|---|---|
| 5,793,432 | A * | 8/1998 | Mishima | H04N 19/649 |
| | | | | 370/471 |
| 6,029,210 | A * | 2/2000 | Yamazaki | G11C 11/4072 |
| | | | | 710/10 |
| 6,272,614 | B1 * | 8/2001 | Calamvokis | G06F 9/322 |
| | | | | 711/216 |
| 6,538,999 | B1 * | 3/2003 | Sato | H04N 21/434 |
| | | | | 348/E5.005 |
| 6,700,873 | B1 * | 3/2004 | Sugaya | H04L 12/5601 |
| | | | | 370/236.2 |
| 2005/0097296 | A1 * | 5/2005 | Chamberlain | G06F 12/023 |
| | | | | 711/170 |
| 2006/0067319 | A1 * | 3/2006 | Sasahara | G06F 13/4286 |
| | | | | 370/392 |
| 2013/0036294 | A1 * | 2/2013 | Steiss | G06F 9/3861 |
| | | | | 712/216 |
| 2014/0122789 | A1 * | 5/2014 | Fujiwara | G06F 13/1642 |
| | | | | 711/105 |

FOREIGN PATENT DOCUMENTS

| | | |
|---|---|---|
| JP | 2006100950 A | 4/2006 |
| JP | 2007156935 A | 6/2007 |

* cited by examiner

FIG. 9

| DEVICE NAME | INITIAL VALUE | RECEIVED DATA A | RECEIVED DATA B | RECEIVED DATA C |
|---|---|---|---|---|
| DATA COMMUNICATION DEVICE 10 | WRITABLE AND READABLE (1) | ONLY WRITABLE (0) | ONLY WRITABLE (0) | WRITABLE AND READABLE (1) |
| DATA COMMUNICATION DEVICE 10A | ONLY WRITABLE (0) | WRITABLE AND READABLE (1) | ONLY WRITABLE (0) | ONLY WRITABLE (0) |
| DATA COMMUNICATION DEVICE 10B | ONLY WRITABLE (0) | ONLY WRITABLE (0) | WRITABLE AND READABLE (1) | ONLY WRITABLE (0) |

DATA COMMUNICATION DEVICE AND DATA COMMUNICATION MODULE

CROSS REFERENCE TO RELATED APPLICATION

This application claims priority from Japanese Patent Application No. 2020-058353 filed on Mar. 27, 2020. The content of this application is incorporated herein by reference in its entirety.

BACKGROUND OF THE DISCLOSURE

1. Field of the Disclosure

The present disclosure relates to a data communication device and a data communication module.

2. Description of the Related Art

A semiconductor device may perform information processing that links multiple devices by transmitting and receiving data to and from each of these devices. In information processing in this case, the devices are connected to a common serial bus to transmit and receive data through the serial bus. Inter-integrated circuit (I2C) may be used as an exemplary transmission/reception protocol using a serial bus. Japanese Unexamined Patent Application Publication No. 2002-236611 discloses a semiconductor device that controls, with I2C, data reading and writing of each device by comparing a device address stored in a non-volatile storage circuit with external identification information inputted through a serial bus.

A configuration in which multiple devices have a common device address may be used. In this case, since the device address is common, in the case of accessing each device using one device address to read data, output is simultaneously made from each device, which results in conflict of signals.

As a conceivable method for avoiding the occurrence of conflict of signals, output from a device from which it is unnecessary to read data is stopped by controlling, from an external terminal, an output buffer circuit connected to a serial bus. However, it is difficult to actively adopt this method from the viewpoint of an increase in the circuit area due to an increase in the number of terminals, and the convenience in terms of control of inputting a control signal for the output buffer circuit from the outside.

BRIEF SUMMARY OF THE DISCLOSURE

In view of the above circumstances, it is an object of the present disclosure to provide a data communication device capable of reading data while simplifying the system configuration as well as achieving reduction of device size.

According to preferred embodiments of the present disclosure, a data communication device includes: a fixed value memory that stores a fixed value; a received data memory that stores received data inputted through a bus; an output data memory that stores output data; a comparison determination unit that outputs a comparison determination result signal indicating a determination result of comparing the fixed value stored in the fixed value memory and a value of the received data stored in the received data memory; a data output unit that has a first state of outputting the output data to the bus and a second state of not outputting the output data to the bus; a command analyzing unit that outputs a data output control signal for controlling whether to output or not output the output data to the bus based on a command inputted through the bus; and an output controller that outputs a control signal for controlling the data output unit to enter the first state or the second state based on the comparison determination result signal and the data output control signal.

According to the present disclosure, a data communication device capable of reading data with improved convenience while achieving reduction of device size is provided. Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 9 is a diagram describing a comparison determination result signal in a data communication device according to the second embodiment.

DETAILED DESCRIPTION OF THE DISCLOSURE

Figure 1:
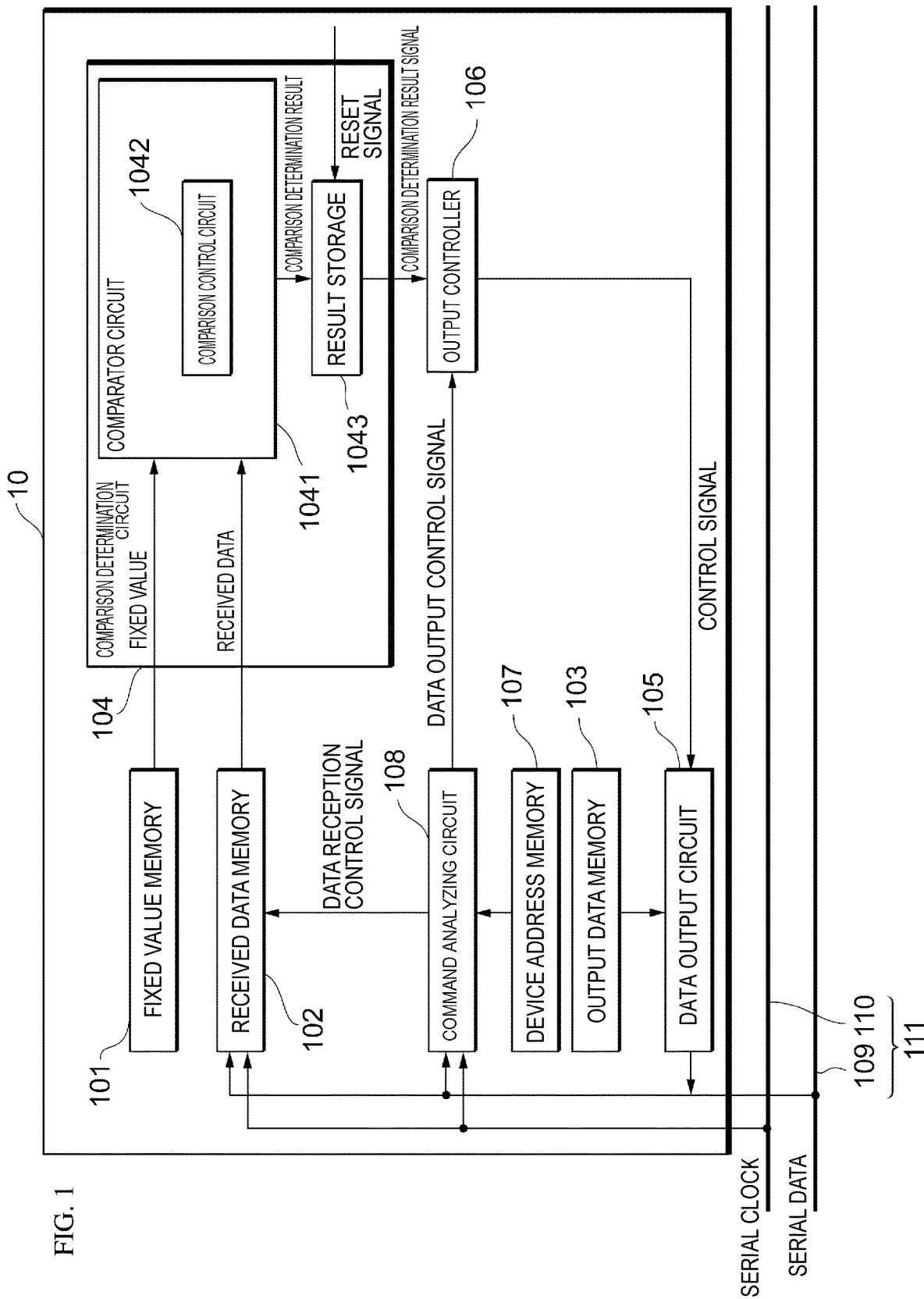
FIG. 1 is a block diagram illustrating the configuration of a data communication device according to a first embodiment.

Hereinafter, embodiments of the present disclosure will be described in detail with reference to the drawings. Note that the same elements are designated by the same reference numerals, and overlapping descriptions are omitted as much as possible.

Referring to FIG. 1, a first embodiment will be described. FIG. 1 is a block diagram illustrating a data communication device 10 according to the first embodiment. The data communication device 10 includes a fixed value memory 101, a received data memory 102, an output data memory 103, a comparison determination unit 104, a data output unit 105, an output controller 106, a device address memory 107, and a command analyzing unit 108.

The data communication device 10 is connected to a bus 111 including a serial data line 109 and a serial clock line 110. The data communication device 10 performs bidirectional communication by writing data or reading data using a two-line bus, as in I2C. Note that the data communication device 10 may conform to I2C or to other communication protocols.

The data communication device 10 is a slave device whose data communication is controlled by a master device (not illustrated) connected to the bus 111.

The fixed value memory 101 stores a fixed value used for controlling data communication of the data communication device 10. For example, the fixed value is a value with a length of 16 bits. The fixed value memory 101 includes, for example, electronic fuses (eFuses), and stores the fixed value which is written from the outside using an electric signal. The fixed value memory 101 may alternatively include metals and store the fixed value which is physically written. Alternatively, the fixed value memory 101 may store the fixed value with the use of a signal outputted from a logic circuit. The fixed value memory 101 may be referred to as a fixed value register.

The received data memory 102 stores received data used for controlling data communication of the data communication device 10. The received data is data inputted through the serial data line 109. The received data has a length corresponding to the fixed value. The received data memory 102 is a rewritable storage area, such as memory, on the data communication device 10.

The output data memory 103 stores data outputted from the data communication device 10. The output data from the data communication device 10 is data processed by a processing circuit (not illustrated) in the data communication device 10. The output data memory 103 is a rewritable storage area, such as memory, on the data communication device 10.

The comparison determination unit 104 is a circuit that outputs a comparison determination result signal indicating a determination result of comparing the fixed value stored in the fixed value memory 101 and the received data stored in the received data memory 102. The comparison determination unit 104 is capable of transmitting and receiving signals to and from the fixed value memory 101, the received data memory 102, and the later-described output controller 106.

The comparison determination unit 104 includes a comparator circuit 1041 and a result storage 1043.

The comparator circuit 1041 includes a comparison control circuit 1042. The comparator circuit 1041 and the comparison control circuit 1042 are logic circuits that perform logic arithmetic processing using the fixed value and the received data. The comparator circuit 1041 obtains the fixed value from the fixed value memory 101. The comparator circuit 1041 obtains the received data from the received data memory 102. The comparator circuit 1041 compares the fixed value with the received data.

The comparator circuit 1041 outputs the comparison determination result to the result storage 1043. The comparison determination result is, for example, a signal that indicates a match when the signal is 1 and a non-match when the signal is 0. The comparison control circuit 1042 controls the process of comparison when the comparator circuit 1041 performs the comparison. Details of the comparison control circuit 1042 will be described later.

The result storage 1043 obtains and stores the comparison determination result from the comparator circuit 1041. The result storage 1043 is a rewritable storage area, such as memory, on the data communication device 10. In response to an input of a reset signal, the result storage 1043 stores the comparison determination result as a certain initial value (such as 1).

The comparison determination unit 104 outputs a comparison determination result signal based on the comparison determination result stored in the result storage 1043 to the later-described output controller 106.

The data output unit 105 is a circuit capable of outputting the output data stored in the output data memory 103 to the serial data line 109. The data output unit 105 has a first state of outputting the output data to the serial data line 109, and a second state of not outputting the output data to the serial data line 109. In the first state, the data communication device 10 is in a data-readable state. In the second state, the data communication device 10 is in a data-unreadable state.

The data output unit 105 obtains the output data from the output data memory 103. A control signal is inputted from the output controller 106 to the data output unit 105, and, on the basis of the control signal, the data output unit 105 is switched between the first state and the second state.

The output controller 106 is a circuit that outputs a control signal to the data output unit 105 on the basis of the comparison determination result signal from the comparison determination unit 104 and a data output control signal outputted from the later-described command analyzing unit 108.

The device address memory 107 stores a device address used by the master device to identify the data communication device 10. The data communication device 10 may perform data communication with the master device when, for example, the master device specifies the device address of the data communication device 10.

The command analyzing unit 108 is a circuit that analyzes a command inputted from the master device. The command analyzing unit 108 obtains the device address from the device address memory 107, and determines whether the command is a command that specifies the data communication device 10. On the basis of a command, the command analyzing unit 108 transmits a data reception control signal for controlling the writing of the received data to the received data memory 102. On the basis of a command, the command analyzing unit 108 transmits a data output control signal to the output controller 106. In addition, the command analyzing unit 108 may analyze commands for other processing in the data communication device 10.

The serial data line 109 is a communication path for exchanging write data including the received data or read data including the output data.

The serial clock line 110 is a communication path for supplying a clock signal from the master device to the data communication device 10. The serial data line 109 and the serial clock line 110 constitute the bus 111.

Figure 2:
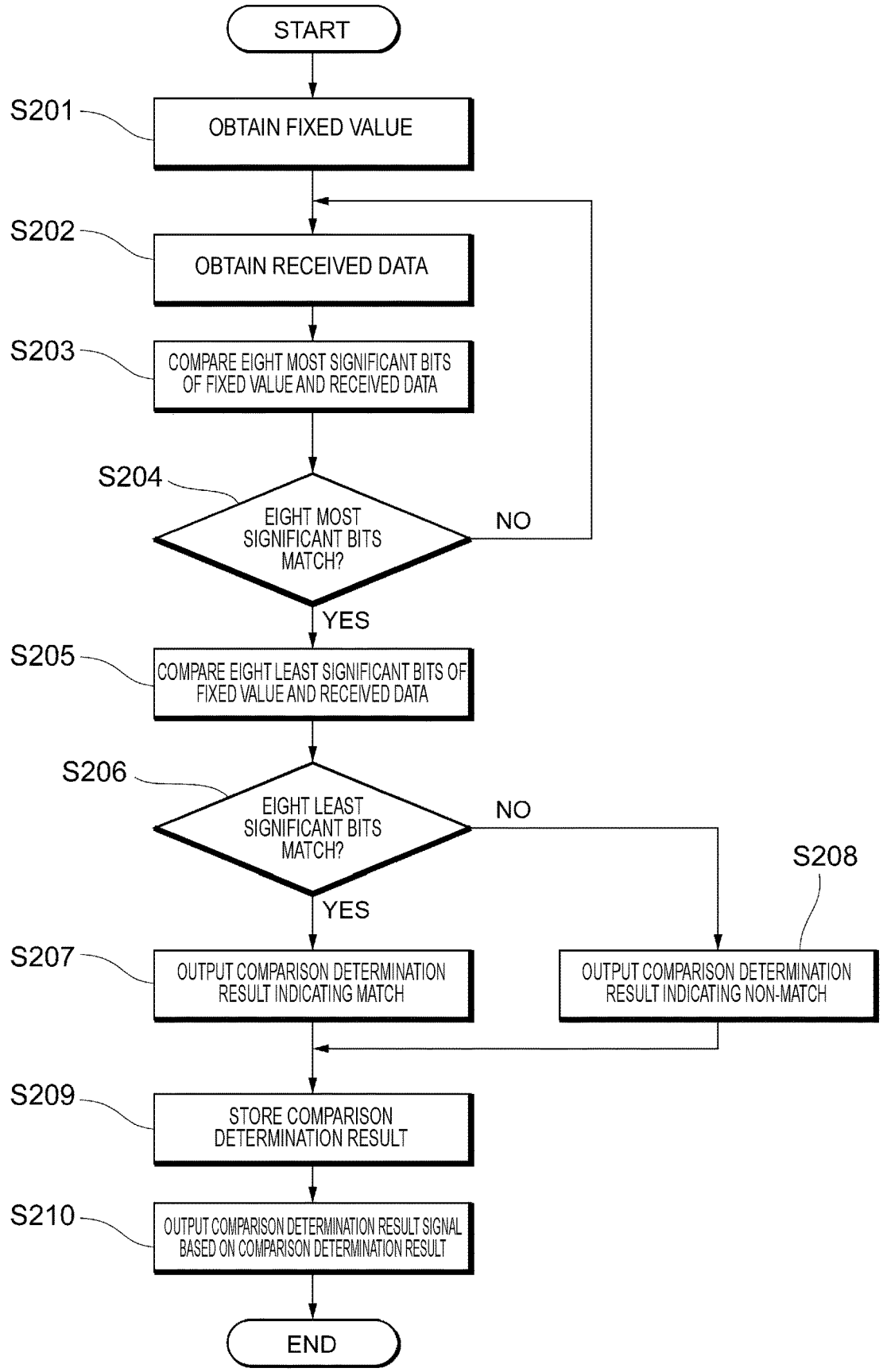
FIG. 2 is a flowchart illustrating a process performed by a comparison determination unit of the data communication device according to the first embodiment.

Referring to FIG. 2, a comparison process performed by the data communication device 10 will be described. Here, it is assumed that the fixed value and the received data are already stored in the fixed value memory 101 and the received data memory 102, respectively.

In step S201, the comparator circuit 1041 reads and obtains the fixed value from the fixed value memory 101. In step S202, the comparator circuit 1041 reads and obtains the received data from the received data memory 102.

In step S203, the comparator circuit 1041 compares the bit values of the eight most significant bits of the received data (first part) with the bit values of the eight most significant bits of the fixed value (second part).

In step S204, the comparison control circuit 1042 determines whether the bit values of the eight most significant bits of each of the fixed value and the received data match. In the case of a negative determination in step S204, the process returns to step S202.

In the case of an affirmative determination in step S204, in step S205, the comparator circuit 1041 compares the bit values of the eight least significant bits of the received data (third part) with the bit values of the eight least significant bits of the fixed value (fourth part).

In step S206, the comparison control circuit 1042 determines whether the eight least significant bits of each of the fixed value and the received data match.

In the case of an affirmative determination in step S206, in step S207, the comparator circuit 1041 outputs a comparison determination result indicating that the fixed value and the received data match to the result storage 1043.

In the case of a negative determination in step S206, in step S208, the comparator circuit 1041 outputs a comparison determination result indicating that the fixed value and the received data do not match to the result storage 1043.

In step S209, the comparison determination result is stored in the result storage 1043.

In step S210, the comparison determination unit 104 outputs a comparison determination result signal on the basis of the comparison determination result.

Referring to FIGS. 3 to 6, a data read command, and switching between the first state and the second state will be described.

Figure 3:
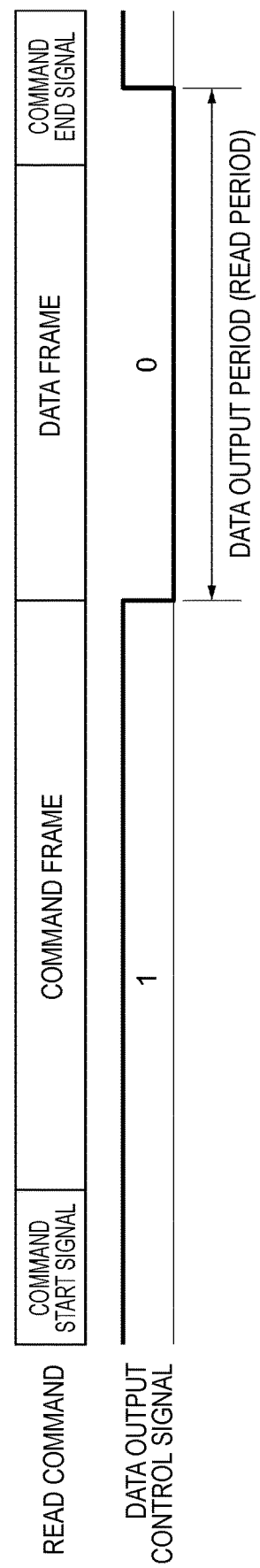
FIG. 3 is a diagram describing a command inputted to the data communication device according to the first embodiment.

FIG. 3 illustrates a read command supplied from the master device to the data communication device 10 through the serial data line 109, and a data output control signal outputted from the command analyzing unit 108.

The read command includes a command start signal indicating the start of the command, a command frame that specifies the device address of the data communication device 10 and specifies reading or writing, a data frame including the output data from the data communication device 10, and a command end signal indicating the end of the command. In addition, the data output control signal is 0 only during a data output period (read period).

Referring to the flowchart illustrated in FIG. 4, a process performed by the data output unit 105 and the output controller 106 will be described.

Figure 4:
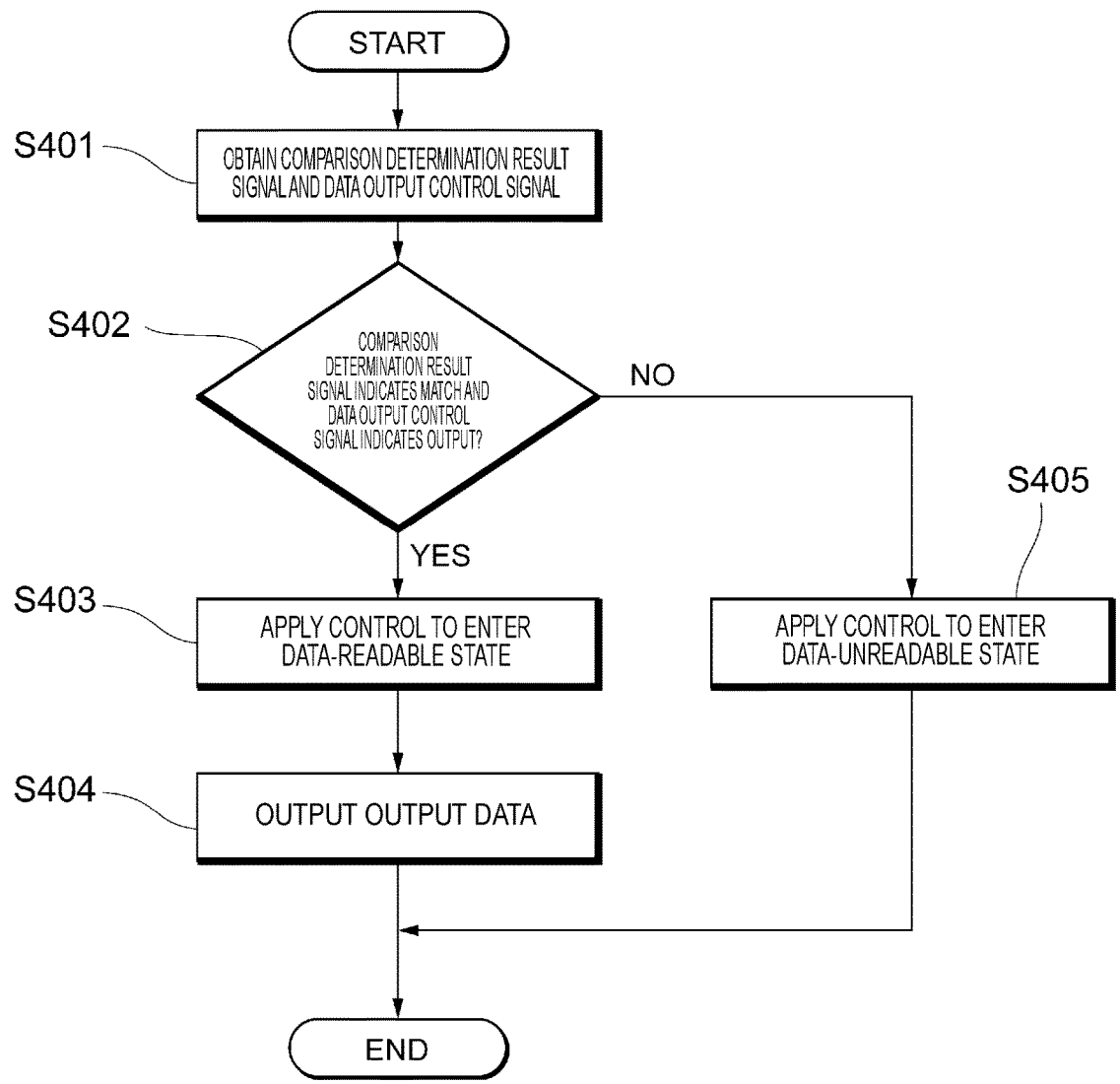
FIG. 4 is a flowchart illustrating a process performed by an output controller of the data communication device according to the first embodiment.

In step S401 in FIG. 4, the output controller 106 obtains the comparison determination result and the data output control signal.

In step S402, the output controller 106 determines whether the comparison determination result indicates a match and whether the data output control signal is a signal indicating the output.

In the case of an affirmative determination in step S402, in step S403, the output controller 106 controls the data output unit 105 to enter a data-readable state. In step S404, the data output unit 105 outputs the output data.

In the case of a negative determination in step S402, in step S405, the output controller 106 controls the data output unit 105 to enter a data-unreadable state. At this time, the output data is not outputted.

Figure 5:
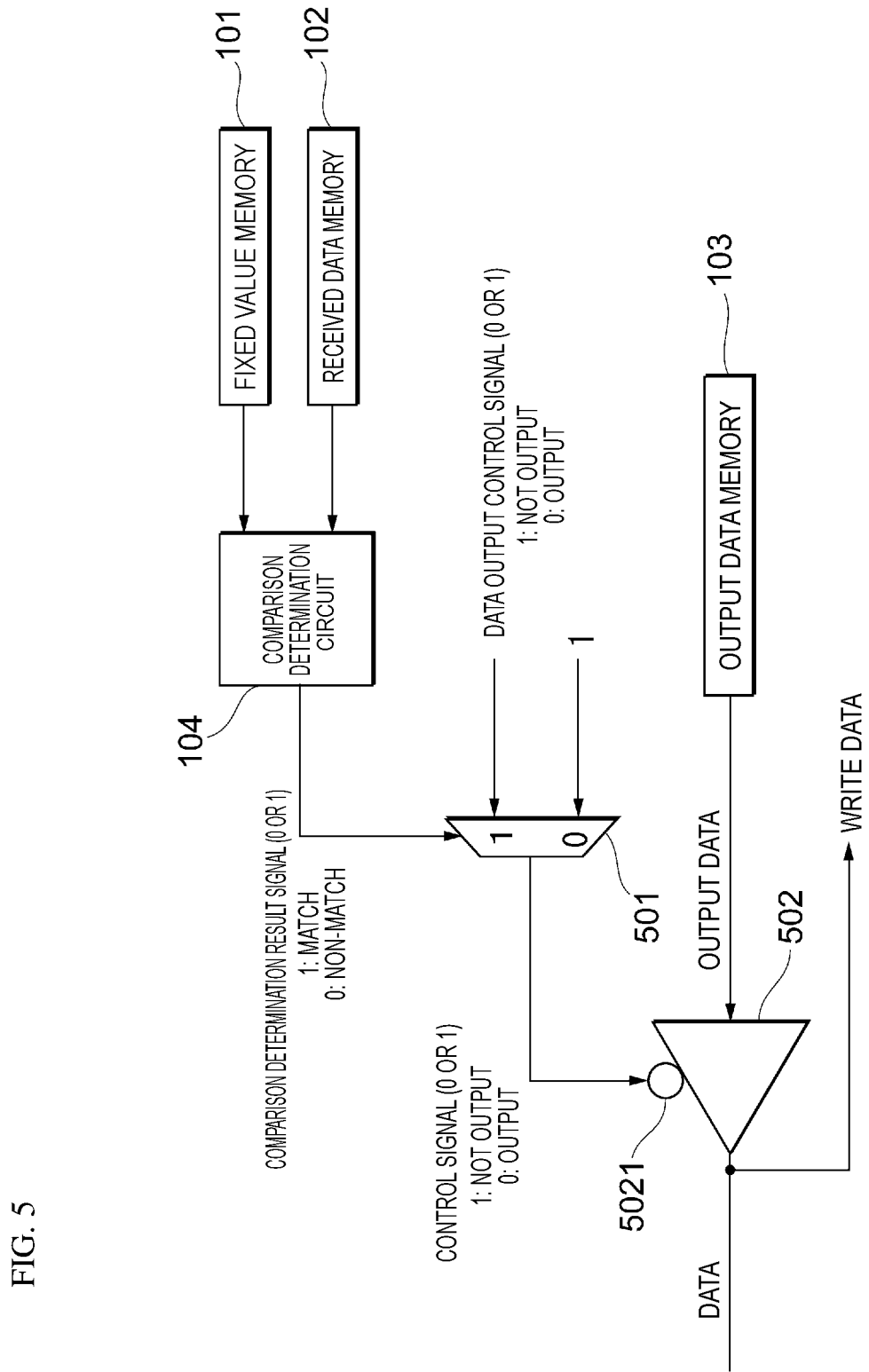
FIG. 5 is a circuit diagram illustrating an example of the output controller and a data output unit of the data communication device according to the first embodiment.
Figure 6:
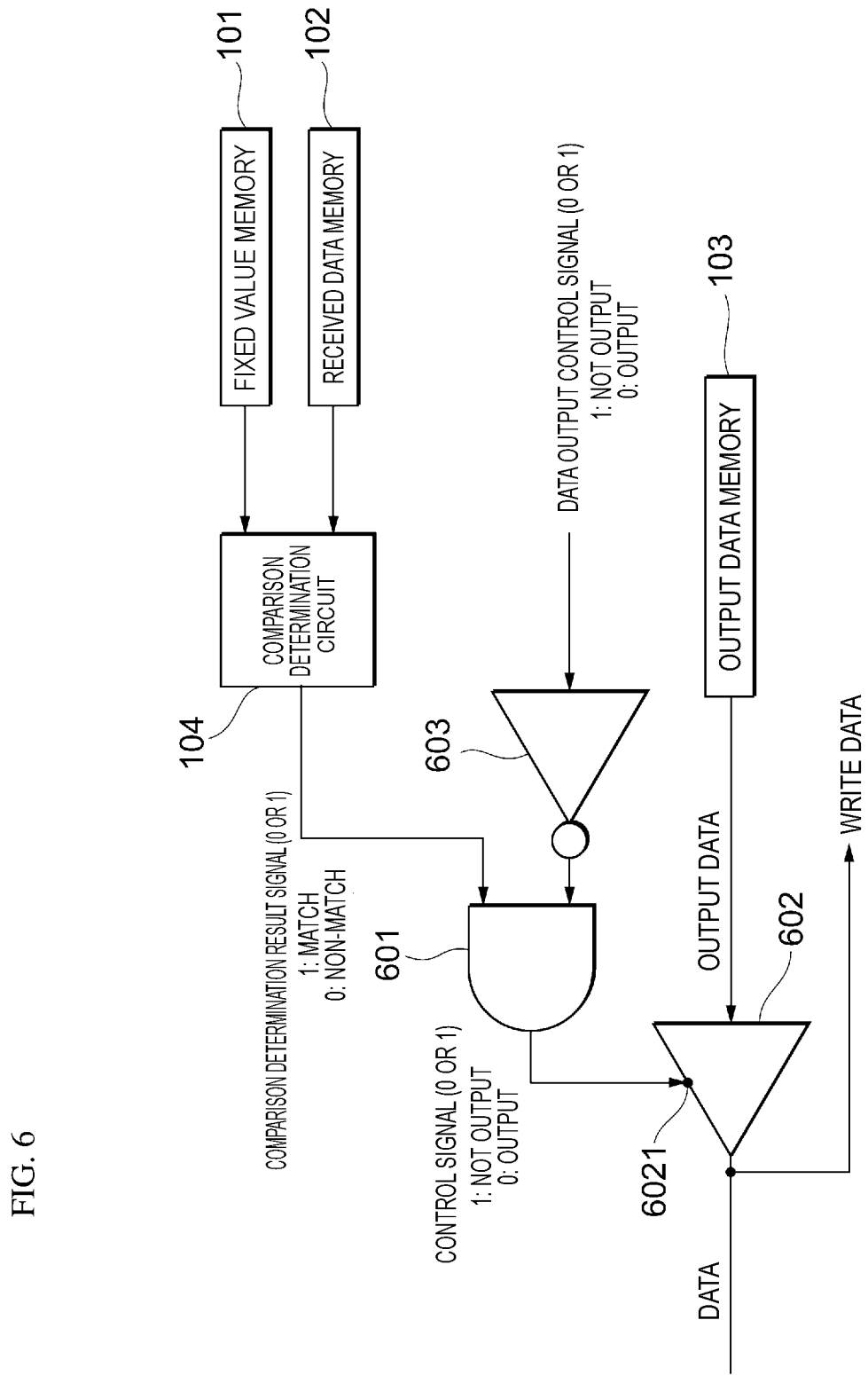
FIG. 6 is a circuit diagram illustrating another example of the output controller and the data output unit of the data communication device according to the first embodiment.

Referring to FIGS. 5 and 6, a more specific example of the data output unit 105 and the output controller 106 will be described. FIG. 5 illustrates an example of the data output unit 105 and the output controller 106 of the data communication device 10. As the output controller 106, a selector 501 is provided. As the data output unit 105, an output buffer 502 is provided.

The comparison determination result signal is inputted from the comparison determination unit 104 to the selector 501. In addition, the data output control signal and a fixed signal indicating 1 are inputted to the selector 501. In response to an input of 1 from the comparison determination unit 104, the selector 501 outputs the data output control signal as a control signal. In response to an input of 0 from the comparison determination unit 104, the selector 501 outputs a signal indicating 1 as a control signal.

The output buffer 502 includes an input/output control terminal 5021. The input/output control terminal 5021 inverts a signal being inputted to the output buffer 502. The output data is inputted from the output data memory 103 to the output buffer 502.

In the case where the control signal inputted to the input/output control terminal 5021 is 0, the signal is inverted to become 1, and the output buffer 502 enters the first state of outputting the output data. In the first state, the output buffer 502 outputs the output data to the serial data line 109. In the first state, the data communication device 10 operates in a readable state of outputting data through the serial data line 109.

In the case where the control signal inputted to the input/output control terminal 5021 is 1, the signal is inverted to become 0, and the output buffer 502 enters the second state of not outputting the output data. In the second state, the data communication device 10 operates in an unreadable state.

In the case where the fixed value in the fixed value memory 101 and the received data in the received data memory 102 match, the comparison determination result signal is 1. At this time, the selector 501 outputs the data output control signal. The data output control signal is 0 only during the data output period. Therefore, the output buffer 502 is in the first state in the data output period during which the control signal is 0. In addition, the output buffer 502 is in the second state in periods other than the data output period. Accordingly, the data becomes readable.

In the case where the fixed value in the fixed value memory 101 and the received data in the received data memory 102 do not match, the comparison determination result signal is 0. Therefore, the selector 501 outputs a signal indicating 1 as the control signal. Because the control signal is 1 regardless of the data output control signal, the output buffer 502 is in the second state. Therefore, the data communication device 10 at this time remains in an unreadable state, regardless of the data output control signal.

FIG. 6 illustrates another example of the data output unit 105 and the output controller 106 of the data communication device 10. As the output controller 106, an AND circuit 601 and a NOT circuit 603 are provided. As the data output unit 105, an output buffer 602 is provided.

The comparison determination result signal from the comparison determination unit 104, and the data output control signal that has been inverted through the NOT circuit 603 are inputted to the AND circuit 601.

The AND circuit 601 takes the logical sum of the comparison determination result signal and the inverted data output control signal, and outputs a signal indicating 1 as the control signal only when both are 1. Otherwise, the AND circuit 601 outputs a signal indicating 0 as the control signal. That is, the AND circuit 601 outputs a control signal indicating 1 only in the case where the fixed value in the fixed value memory 101 and the received data in the received data memory 102 match, and the data output control signal is in the data output period.

The output buffer 602 includes an input/output control terminal 6021. The control signal is inputted, without being inverted through the input/output control terminal 6021, to the output buffer 602. The output data is inputted from the output data memory 103 to the output buffer 602.

In the case where the control signal is 1, the output buffer 602 is in the first state of outputting the output data. In the first state, the data communication device 10 operates in a readable state.

In the case where the control signal is 0, the output buffer 602 is in the second state of not outputting the output data. In the second state, the data communication device 10 operates in an unreadable state.

In the case where the comparison determination result signal is 1, the output buffer 602 is switched between the first state and the second state in accordance with the data output control signal. Accordingly, like the output buffer 502, data may be read from the data communication device 10.

In the case where the comparison determination result signal is 0, the output buffer 602 is in the second state, regardless of the data output control signal. The data communication device 10 at this time remains in an unreadable state, regardless of the data output control signal.

Note that the descriptions of the signals used in FIGS. 5 and 6 are only exemplary and are not limited to the values mentioned here.

Figure 7:
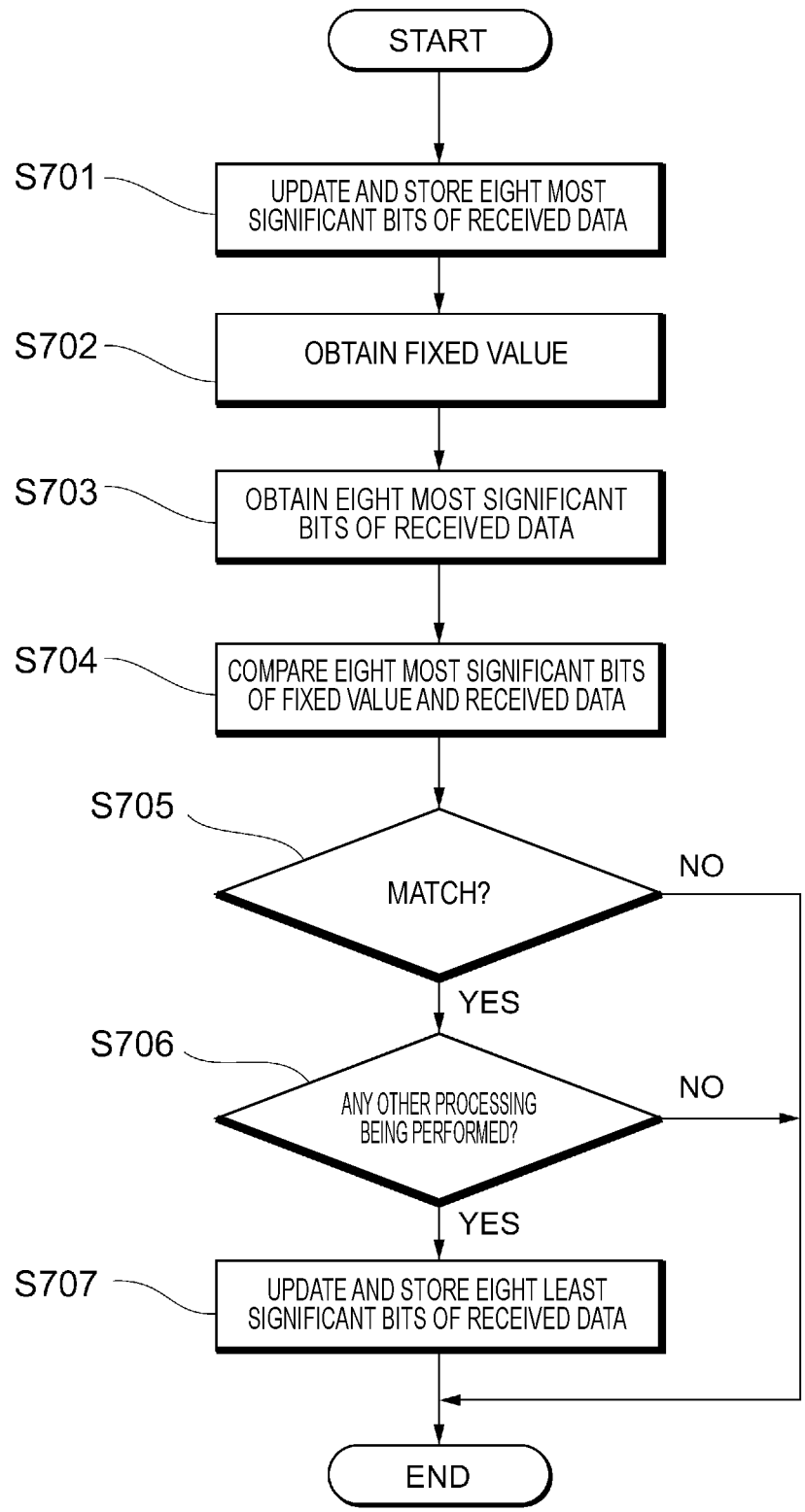
FIG. 7 is a flowchart illustrating a process performed by the data communication device according to the first embodiment.

Referring to the flowchart illustrated in FIG. 7, a process performed by the data communication device 10 at the time the received data is written to the received data memory 102 will be described. It is assumed here that a process of updating the received data has been selected on the basis of the result of analyzing, by the command analyzing unit 108, a command inputted through the serial data line 109.

In step S701, the received data memory 102 updates and stores the bit values of the eight most significant bits of the received data (first part).

In step S702, the comparator circuit 1041 obtains the fixed value from the fixed value memory 101. In step S703, the comparator circuit 1041 obtains the eight most significant bits of the received data.

In step S704, the comparator circuit 1041 compares the bit values of the eight most significant bits of the fixed value (second part) with the bit values of the eight most significant bits of the received data.

In step S705, the comparison control circuit 1042 determines whether the bit values of the eight most significant bits of each of the fixed value and the received data match.

In the case of an affirmative determination in step S705, in step S706, the comparison control circuit 1042 determines whether writing to portions other than the received data memory 102, reading from the data communication device 10, or an error has occurred.

In the case of a negative determination in step S706, in step S707, the output data memory 103 updates and stores the bit values of the eight least significant bits of the received data (third part).

In the case of a negative determination in step S705 or in the case of an affirmative determination in step S706, the eight least significant bits are not updated. In this case, the data communication device 10 performs the processing from step S701 onward again.

This may prevent malfunctions as follows: on receipt of data by a procedure other than a predetermined procedure, as a result of comparison of the fixed value and the received data on the basis of the fixed value and the received data, the comparison determination result signal outputted from the comparison determination unit 104 changes, which gives rise to transition from a readable state to an unreadable state, or vice versa.

Figure 8:
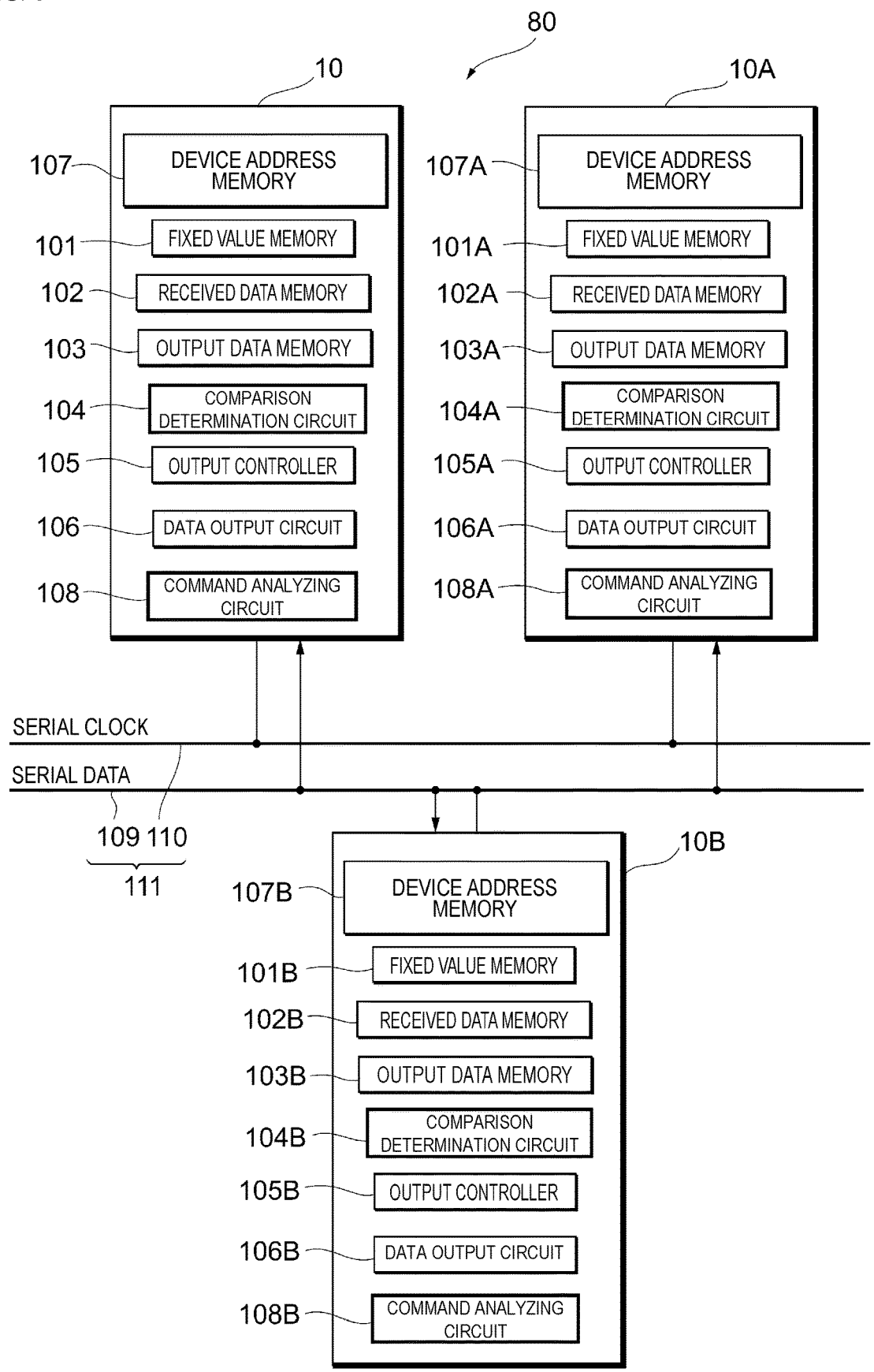
FIG. 8 is a block diagram illustrating the configuration of a data communication module according to a second embodiment.

A second embodiment will be described. From the second embodiment onward, the descriptions of the points common to those of the first embodiment are omitted, and only different points will be described. In particular, the same or similar operations and effects obtained by the same or similar configurations will not be mentioned in each embodiment. FIG. 8 is a block diagram of a data communication module 80 according to the second embodiment.

The data communication module 80 includes data communication devices 10, 10A, and 10B. The data communication device 10 is the data communication device 10 described in the first embodiment. The data communication device 10A has the same configuration as the data communication device 10, and includes a fixed value memory 101A to a command analyzing unit 108A. The data communication device 10B also includes a fixed value memory 101B to a command analyzing unit 108B, like the data communication device 10A.

The data communication devices 10, 10A, and 10B are connected to the bus 111 including the serial data line 109 and the serial clock line 110.

The data communication devices 10, 10A, and 10B have the same device address. In short, the same device address is stored in the device address memories 107, 107A, and 107B.

The data communication devices 10, 10A, and 10B have different fixed values. In short, different fixed values are stored in the fixed value memories 101, 101A, and 101B. Specifically, a first fixed value is stored in the fixed value memory 101. A second fixed value is stored in the fixed value memory 101A. A third fixed value is stored in the fixed value memory 101B.

The data communication devices 10, 10A, and 10B are connected to the same bus 111. Since the device address is common, in the case where an external device such as a master device (not illustrated) specifies a certain device address and writes the received data, all the data communication devices 10, 10A, and 10B are selected to write the received data.

Using their respective comparison determination units 104, 104A, and 104B, the data communication devices 10, 10A, and 10B compare their respective fixed values with the received data, and output comparison determination result signals. Their respective data output units 105, 105A, and 105B are controlled on the basis of the comparison determination result signals by the output controllers 106, 106A, and 106B.

Whether to allow each of the data communication devices 10, 10A, and 10B to be in a writable-and-readable state or to be in an only-writable state may be set by having the received data correspond to their respective fixed values of the data communication devices 10, 10A, and 10B.

FIG. 9 is a diagram illustrating the switching of the state of the data communication devices 10, 10A, and 10B for each received data.

FIG. 9 has items for device name, initial value, received data A, received data B, and received data C. The initial value corresponds to a state in which, for example, a reset signal is inputted when the data communication module 80 is turned off and then reactivated. A reset signal may sometimes be inputted in response to a command from the master device. The received data A corresponds to the case where the received data that matches with the fixed value stored in the fixed value memory 101A is written to each data communication device. The received data B corresponds to the case where the received data that matches with the fixed value stored in the fixed value memory 101B is written to each data communication device. The received data C corresponds to the case where the received data that matches with the fixed value stored in the fixed value memory 101 is written to each data communication device.

After reading or writing, the comparison determination result signal is indicated as (1) or (0). Here, each data communication device is configured to be in a writable-and-readable state when the comparison determination result signal is 1, and in an only-writable state when the comparison determination result signal is 0.

For example, in the case of the initial value, the result storage 1043 stores, as a certain initial value, the comparison determination result which allows the comparison determination unit 104 to output 1 as the comparison determination result signal. In addition, the result storages of the data communication devices 10A and 10B store, as the initial value, the comparison determination result which allows the comparison determination units 104A and 104B to output 0 as the comparison determination result signal. At this time, because data reading is only allowed from the data communication device 10, the read data will not conflict with other data on the bus 111.

In the case where the received data B is written as the received data to the data communication devices 10, 10A, and 10B, the data communication devices 10 and 10A enter an only-writable state since their fixed values and the received data B do not match. Only the data communication device 10B enters a writable-and-readable state. Therefore, the conflict of data does not occur on the bus 111. The same applies to the case in which the received data A is written and the case in which the received data C is written.

So far, the exemplary embodiments of the present disclosure have been described. The data communication device 10 according to the first embodiment includes: the fixed value memory 101, which stores a fixed value; the received data memory 102, which stores received data inputted through the bus 111; the output data memory 103, which stores output data; the comparison determination unit 104, which outputs a comparison determination result signal indicating a determination result of comparing the fixed value stored in the fixed value memory 101 with a value of the received data stored in the received data memory 102; the data output unit 105, which has a first state of outputting the output data to the bus 111 and a second state of not outputting the output data to the bus 111; the command analyzing unit 108, which outputs a data output control signal for controlling whether to output or not output the output data to the bus 111 based on a command inputted through the bus 111; and the output controller 106, which outputs a control signal for controlling the data output unit 105 to enter the first state or the second state based on the comparison determination result signal and the data output control signal.

Accordingly, the state of output from the data communication device 10, which is based on the determination result of comparing the received data with the fixed value, may be switched by rewriting the received data. More specifically, the data communication device 10 may be switched between a data-readable state and a data-unreadable state by generating a control signal using the received data that is inputted separately from a data output control signal. Since the received data is inputted through the bus 111, a terminal for switching the state is not required for the data communication device 10, resulting in size reduction. In addition, because switching of the received data may be performed through the bus 111 and a separate controller is not required, the system configuration may be simplified.

In the data communication device 10, the comparison determination unit 104 includes the comparator circuit 1041, which compares the bit values of the fixed value with the bit values of the received data and outputs a comparison determination result, and the result storage 1043, which stores the comparison determination result. A comparison determination result signal is outputted on the basis of the comparison determination result stored in the result storage 1043. Accordingly, comparison processing need not be performed at all times.

In the data communication device 10, in response to an input of a reset signal to the result storage 1043, the result storage 1043 updates the comparison determination result to a certain initial value and stores the updated value. Accordingly, the operation in the case of, for example, power-on-and-reset may be set in advance.

In the data communication device 10, the comparator circuit 1041 further includes the comparison control circuit 1042. The comparison control circuit 1042 stores a first part, which is composed of some of the bit values of the received data written through the bus 111, performs a first comparison process of comparing a second part of the bit values of the fixed value at positions corresponding to the first part with the first part, stores a third part, which is composed of bit values other than the first part of the received data, written through the bus 111, after the first comparison process, and performs a second comparison process of comparing a fourth part of the bit values of the fixed value at positions corresponding to the third part with the third part. The comparator circuit 1041 outputs a comparison determination result based on the results of the first comparison process and the second comparison process.

This may prevent malfunctions as follows: on receipt of data by a procedure other than a predetermined procedure, as a result of comparison of the fixed value and the received data, the comparison determination result signal outputted from the comparison determination unit 104 changes, which gives rise to transition to a readable state, or vice versa.

The data communication module according to the second embodiment includes the data communication device 10 (first data communication device) and the data communication device 10A (second data communication device). The data communication device 10 and the data communication device 10A are connected to the same bus 111 and have the same device address for identifying a device that outputs the output data. The fixed value of the data communication device 10 is a first fixed value. The fixed value of the data communication device 10A is a second fixed value different from the first fixed value. The received data memory 102 of the data communication device 10 and the received data memory 102A of the data communication device 10A are configured to receive the same received data from the bus 111.

By allowing the received data inputted to the data communication device 10 and the data communication device 10A to be a value that matches the first fixed value or the second fixed value, the state of the data communication device 10 and the data communication device 10A is switched to a writable-and-readable state or to an only-writable state. Accordingly, because data reading is only allowed from the data communication device corresponding to the received data, the read data will not conflict with other data on the bus 111. Therefore, using the data communication devices 10 and 10A, the data communication module 80 may operate to read values individually from multiple devices having the same device address. Because the data communication devices 10 and 10A are used, the size of the module may be reduced, and the system configuration may be simplified.

The foregoing description of the embodiments has been provided to facilitate the understanding of the present disclosure, and is not intended to limit the interpretation of the present disclosure. The present disclosure may be modified or improved without departing from the spirit thereof, and the present disclosure includes equivalents thereof. That is, the embodiments with design changes appropriately added by those skilled in the art are also included in the scope of the present disclosure as long as they have features of the present disclosure. For example, elements included in the embodiments, their arrangements, conditions, etc. are not limited to those illustrated, and may be changed appropriately. Needless to say, the embodiments are examples for illustrative purposes only, configurations mentioned in different embodiments may be partially replaced or combined, and they are also included in the scope of the present disclosure as long as they have features of the present disclosure. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A data communication device comprising:
a fixed value memory configured to store a fixed value;
a received data memory configured to store received data input to the data communication device through a bus;
an output data memory configured to store output data;
a comparison determination circuit configured to output a comparison determination result signal indicating a determination result of comparing the fixed value stored in the fixed value memory and a value of the received data stored in the received data memory;
a data output circuit configured to output the output data to the bus when operating in a first state, and not to output the output data to the bus when operating in a second state;
a command analyzing circuit configured to output a data output control signal based on a command input through the bus, the data output control signal controlling whether or not to output the output data to the bus; and
an output controller configured to output a control signal to the data output circuit based on the comparison determination result signal and the data output control signal, the data output circuit being configured to operate in the first state or the second state based on the control signal.

2. The data communication device according to claim 1, wherein:
the comparison determination circuit comprises:
a comparator circuit configured to compare bit values of the fixed value and bit values of the received data, and to output a comparison determination result based on a result of the comparison; and
a result storage configured to store the comparison determination result, and the comparison determination result signal is output based on the comparison determination result stored in the result storage.

3. The data communication device according to claim 2, wherein,
in response to an input of a reset signal to the result storage, the result storage is configured to update the comparison determination result to an initial value and to store the updated value.

4. The data communication device according to claim 2, wherein:
the comparator circuit further comprises a comparison control circuit, and
the comparison control circuit is configured to:
store a first part that comprises some of the bit values of the received data written through the bus;
perform a first comparison process of comparing a second part and the first part, the second part comprising bit values of the fixed value at positions corresponding to the bit values of the first part;
after the first comparison process, store a third part comprising bit values of the received data other than the bit values of the first part;
perform a second comparison process of comparing a fourth part and the third part, the fourth part comprising bit values of the fixed value at positions corresponding to the bit values of the third part; and
output the comparison determination result based on results of the first comparison process and the second comparison process.

5. The data communication device according to claim 4, wherein the first and second parts are an eight most significant bits of the received data and fixed value, respectively, and
wherein the third and fourth parts are an eight least significant bits of the received data and fixed value, respectively.

6. The data communication device according to claim 4, wherein
the second comparison process is only performed if the first comparison process determines the first part matches the second part.

7. The data communication device according to claim 1, wherein
the fixed value memory is configured to record the fixed value using a plurality of metal layers or metal lines.

8. The data communication device according to claim 1, wherein
the fixed value memory is configured to record the fixed value using a plurality of electronic fuses.

9. The data communication device according to claim 1, wherein
the fixed value memory is configured to record the fixed value using a signal output from a logic circuit.

10. A data communication module comprising:
first and second data communication devices according to claim 1, wherein:
the first data communication device and the second data communication device are connected to the same bus and have a same device address identifying a device that outputs the output data,
the fixed value of the first data communication device is a first fixed value,
the fixed value of the second data communication device is a second fixed value different from the first fixed value, and
the received data memory of the first data communication device and the received data memory of the second data communication device are configured to receive the same received data from the bus.

11. The data communication device according to claim 1, wherein the command analyzing circuit is further configured to determine whether the command input is a command that specifies the data communication device based on a retrieved device address.

12. The data communication device according to claim 1, wherein when operating in the first state, the data communication device is in a data-readable state, and
wherein when operating in the second state, the data communication device is in a data-unreadable state.

13. The data communication device according to claim 1, wherein the fixed value memory comprises a fixed value register.

* * * * *